(12) United States Patent
Hata

(10) Patent No.: US 8,861,201 B2
(45) Date of Patent: Oct. 14, 2014

(54) ELECTRONIC APPARATUS

(75) Inventor: Yukihiko Hata, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 13/327,493

(22) Filed: Dec. 15, 2011

(65) Prior Publication Data

US 2012/0087093 A1   Apr. 12, 2012

Related U.S. Application Data

(63) Continuation of application No. 12/878,952, filed on Sep. 9, 2010, now Pat. No. 8,098,490.

(30) Foreign Application Priority Data

Nov. 20, 2009  (JP) ................................. 2009-265354

(51) Int. Cl.
*H05K 7/20* (2006.01)

(52) U.S. Cl.
USPC ........... 361/700; 361/699; 361/702; 361/709; 361/711; 165/80.4

(58) Field of Classification Search
None
See application file for complete search history.

(56) References Cited

U.S. PATENT DOCUMENTS

| | | | | |
|---|---|---|---|---|
| 6,621,698 B2 * | 9/2003 | Chang | ...................... | 361/679.47 |
| 7,277,286 B2 * | 10/2007 | Lee | .............................. | 361/700 |
| 7,474,527 B2 * | 1/2009 | Wu | .......................... | 361/679.48 |
| 7,542,293 B2 * | 6/2009 | Zhao et al. | .................... | 361/700 |
| 7,613,001 B1 * | 11/2009 | Liu et al. | ....................... | 361/700 |
| 7,656,665 B2 | 2/2010 | Lin et al. | | |
| 7,710,724 B2 * | 5/2010 | Takeguchi et al. | ............ | 361/700 |
| 7,742,295 B2 | 6/2010 | Hata et al. | | |
| 7,965,512 B2 * | 6/2011 | Huang et al. | .................. | 361/700 |
| 7,986,520 B2 * | 7/2011 | Yamaguchi et al. | ...... | 361/679.47 |
| 2003/0019607 A1 | 1/2003 | Wei | | |
| 2008/0066891 A1 * | 3/2008 | Jeng | ........................ | 165/104.26 |
| 2008/0093056 A1 * | 4/2008 | Hwang et al. | ............ | 165/104.33 |
| 2008/0253082 A1 | 10/2008 | Lev et al. | | |
| 2009/0014160 A1 * | 1/2009 | Hsiao | ............................ | 165/121 |
| 2009/0103262 A1 * | 4/2009 | Hata | ............................ | 361/689 |
| 2010/0195280 A1 | 8/2010 | Huang et al. | | |
| 2010/0246125 A1 * | 9/2010 | Okutsu | ........................ | 361/695 |
| 2011/0075360 A1 * | 3/2011 | Tomioka et al. | .............. | 361/695 |
| 2011/0122584 A1 | 5/2011 | Hata | | |

FOREIGN PATENT DOCUMENTS

| | | |
|---|---|---|
| JP | S53-96559 A | 8/1978 |
| JP | 10-281671 | 10/1998 |
| JP | 2003-336976 | 11/2003 |
| JP | 2009-181215 | 8/2009 |

OTHER PUBLICATIONS

Notification of Reasons of Rejection mailed by Japan Patent Office on Dec. 21, 2010 in Japanese patent application No. 2009-265354 in 10 pages.

* cited by examiner

*Primary Examiner* — Boris Chervinsky

(74) *Attorney, Agent, or Firm* — Knobbe, Martens, Olson & Bear LLP

(57) ABSTRACT

According to one embodiment, an electronic apparatus includes a housing, a first heating element in the housing, a heat sink in the housing, a first pressing member, a first heat pipe, and a second heat pipe. The first heat pipe has a plate shape, includes a first portion facing the first heating element and a second portion being outside the first heating element. The first heat pipe is configured to be bent by the first pressing member. The second heat pipe is connected to the second portion of the first heat pipe and the heat sink.

22 Claims, 11 Drawing Sheets

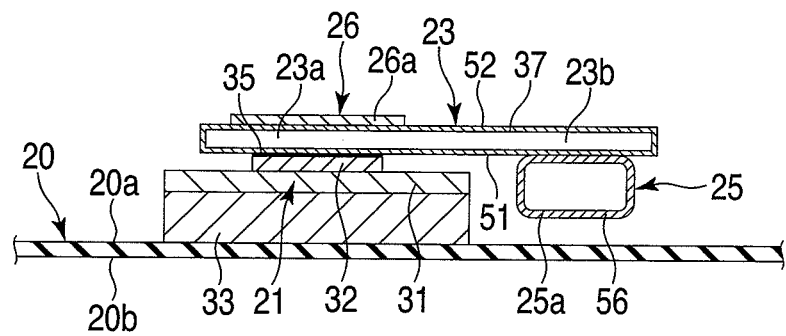
F I G. 3
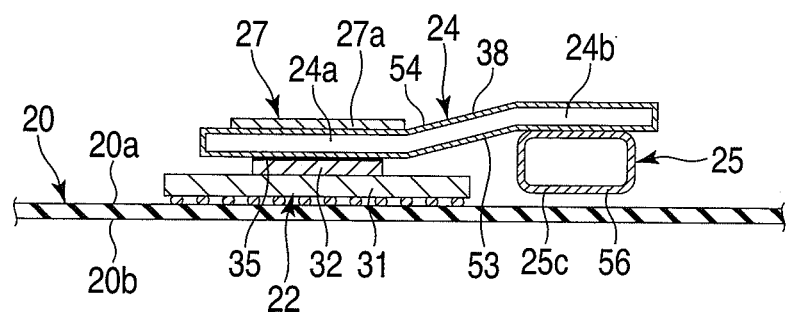
F I G. 4

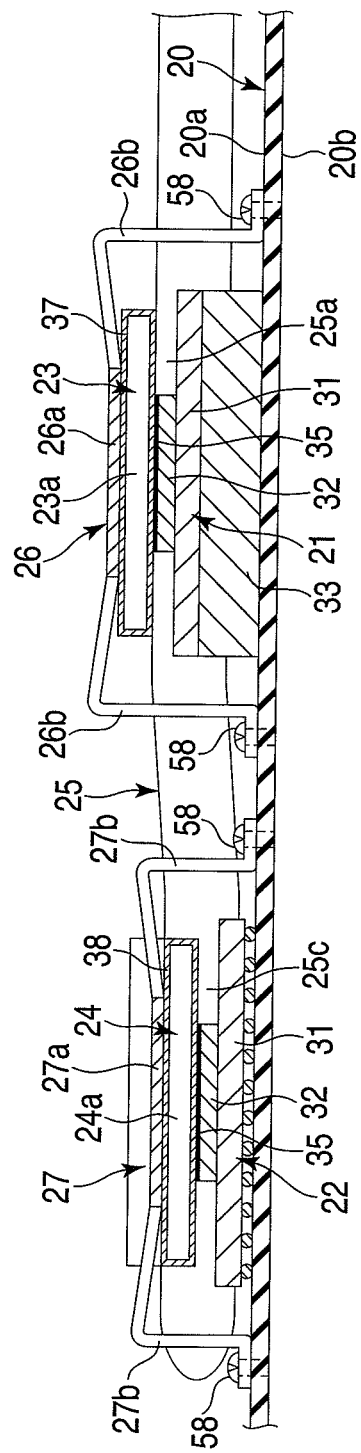
F I G. 5

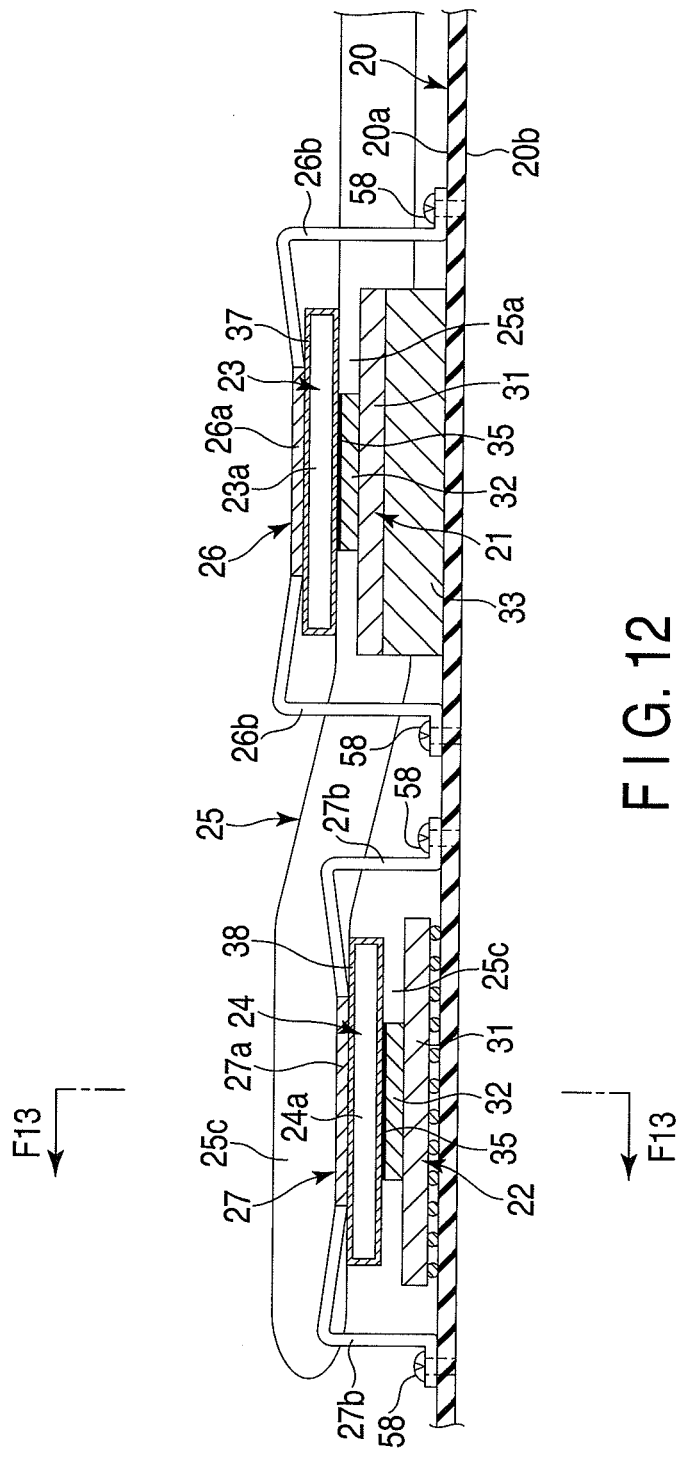
F I G. 12

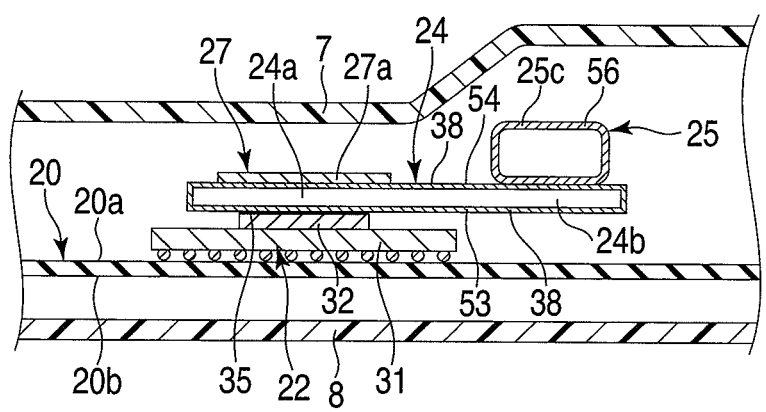
F I G. 13

ELECTRONIC APPARATUS

CROSS-REFERENCE TO RELATED APPLICATIONS

This application is a continuation of U.S. patent application Ser. No. 12/878,952, filed on Sep. 9, 2010, which is based upon and claims the benefit of priority from Japanese Patent Application No. 2009-265354, filed Nov. 20, 2009, the entire contents of each of which are incorporated herein by reference.

FIELD

Embodiments described herein relate generally to an electronic apparatus comprising a heat pipe.

BACKGROUND

Electronic apparatuses, such as notebook PCs, comprise a heating element mounted on a circuit board and a heat pipe that transmits heat generated from the heating element to a heat sink. The heat pipe is arranged above or below the heating element, and the heating element, the circuit board, and the heat pipe overlap each other.

Jpn. Pat. Appln. KOKAI Publication No. 10-281671 discloses a thin plate-shaped heat pipe. In Jpn. Pat. Appln. KOKAI Publication No. 10-281671, the thin plate-shaped heat pipe with a predetermined length is used as a unit module and a plurality of unit modules are connected to each other by a low thermal resistance structure.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 3 is an exemplary cross-sectional view illustrating the heat radiating structure taken along the line F3-F3 of FIG. 2;

FIG. 4 is an exemplary cross-sectional view illustrating the heat radiating structure taken along the line F4-F4 of FIG. 2;

FIG. 5 is an exemplary cross-sectional view illustrating the heat radiating structure taken along the line F5-F5 of FIG. 2;

FIG. 12 is an exemplary cross-sectional view illustrating the heat radiating structure taken along the line F12-F12 of FIG. 11; and FIG. 13 is an exemplary cross-sectional view illustrating the heat radiating structure taken along the line F13-F13 of FIG. 12.

DETAILED DESCRIPTION

Various embodiments will be described hereinafter with reference to the accompanying drawings. In general, according to one embodiment, an electronic apparatus comprises a housing, a first heating element in the housing, a heat sink in the housing, a first pressing member, a first heat pipe, and a second heat pipe. The first heat pipe has a plate shape, comprises a first portion facing the first heating element and a second portion being outside the first heating element. The first heat pipe is configured to be bent by the first pressing member. The second heat pipe is connected to the second portion of the first heat pipe and the heat sink.

Hereinafter, exemplary embodiments applied to a notebook PC will be described with reference to the accompanying drawings.

First Embodiment

FIGS. 1 to 5 show an electronic apparatus 1 according to a first embodiment. The electronic apparatus 1 is, for example, a notebook PC. However, electronic apparatuses to which the embodiment can be applied are not limited thereto. The invention can be widely applied to various kinds of electronic apparatuses, such as a PDA (Personal Digital Assistant) and a game machine.

Figure 1:
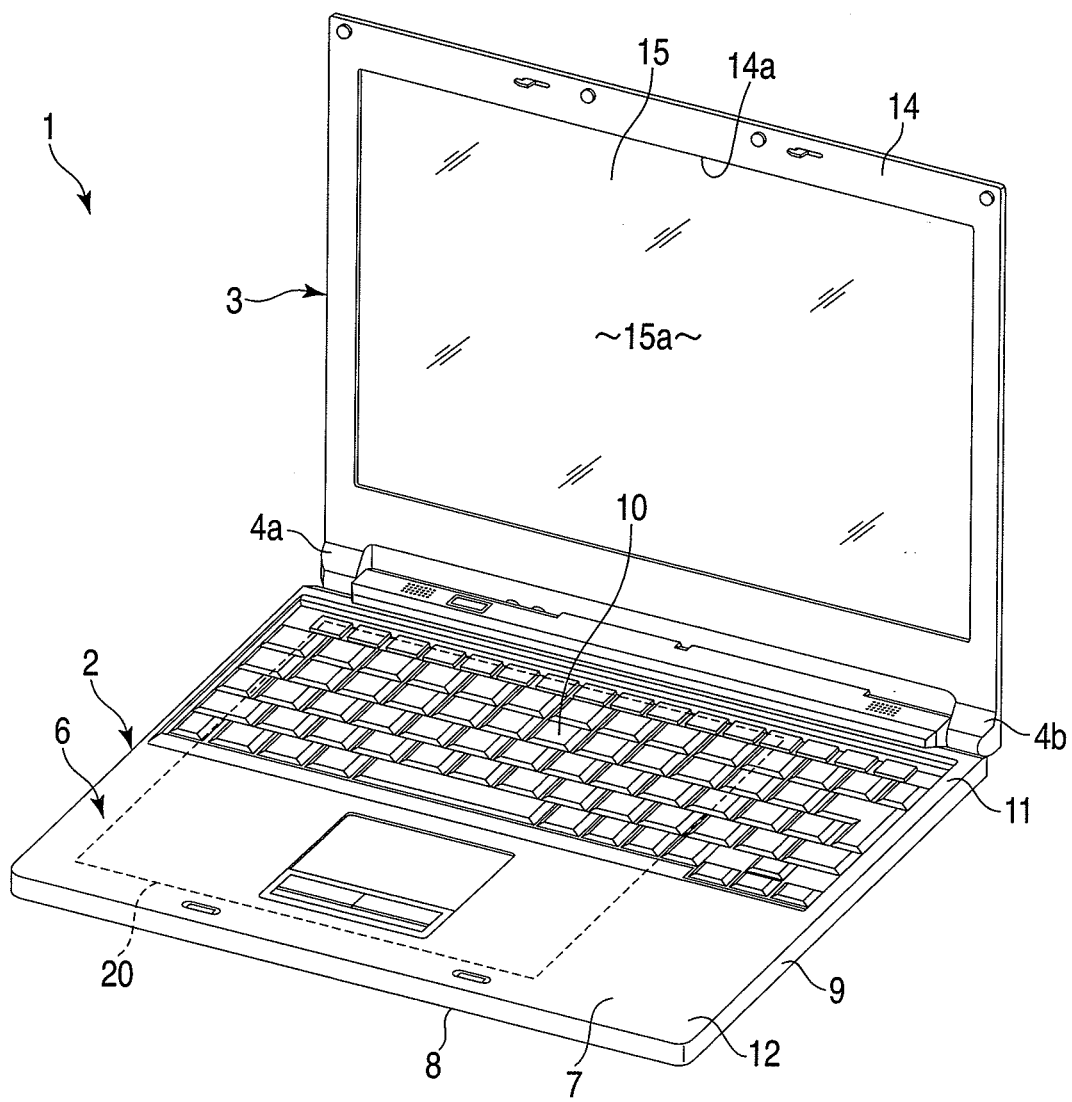
FIG. 1 is an exemplary perspective view illustrating an electronic apparatus according to a first embodiment.

As shown in FIG. 1, the electronic apparatus 1 comprises a main unit 2, a display unit 3, and first and second hinges 4a and 4b. The main unit 2 is an electronic apparatus main body provided with a main board. The main unit 2 comprises a housing 6. The housing 6 has a flat box shape comprising an upper wall 7, a lower wall 8, and a circumferential wall 9.

The lower wall 8 faces a desk surface when the electronic apparatus 1 is placed on a desk. The lower wall 8 is substantially parallel to the desk surface. The upper wall 7 is opposite to the lower wall 8 with a space therebetween and extends substantially in parallel (that is, substantially in a horizontal direction) to the lower wall 8. A keyboard 10 is provided on the upper wall 7. The circumferential wall 9 rises with respect to the lower wall 8, and connects the edge of the lower wall 8 and the edge of the upper wall 7.

As shown in FIG. 1, the main unit 2 comprises a rear end portion 11, which is a first end portion, and a front end portion 12, which is a second end portion. The display unit 3 is rotatably (openably) connected to the rear end portion 11 by, for example, the first and second hinges 4a and 4b. The front end portion 12 is opposite to the rear end portion 11 in the main unit 2. In the specification, the side closer to the user is defined as the front side and the side away from the user is defined as the rear side. In addition, the left and right sides are defined in the user's viewing direction.

As shown in FIG. 1, the display unit 3 comprises a display housing 14 and a display device 15 accommodated in the display housing 14. The display housing 14 comprises a relatively large opening 14a through which a display screen 15a of the display device 15 is exposed to the outside. The display unit 3 can be pivoted between a closed position where the display unit 3 falls and covers the main unit 2 from the upper side and an opened position where the display unit 3 rises with respect to the main unit 2.

Figure 2:
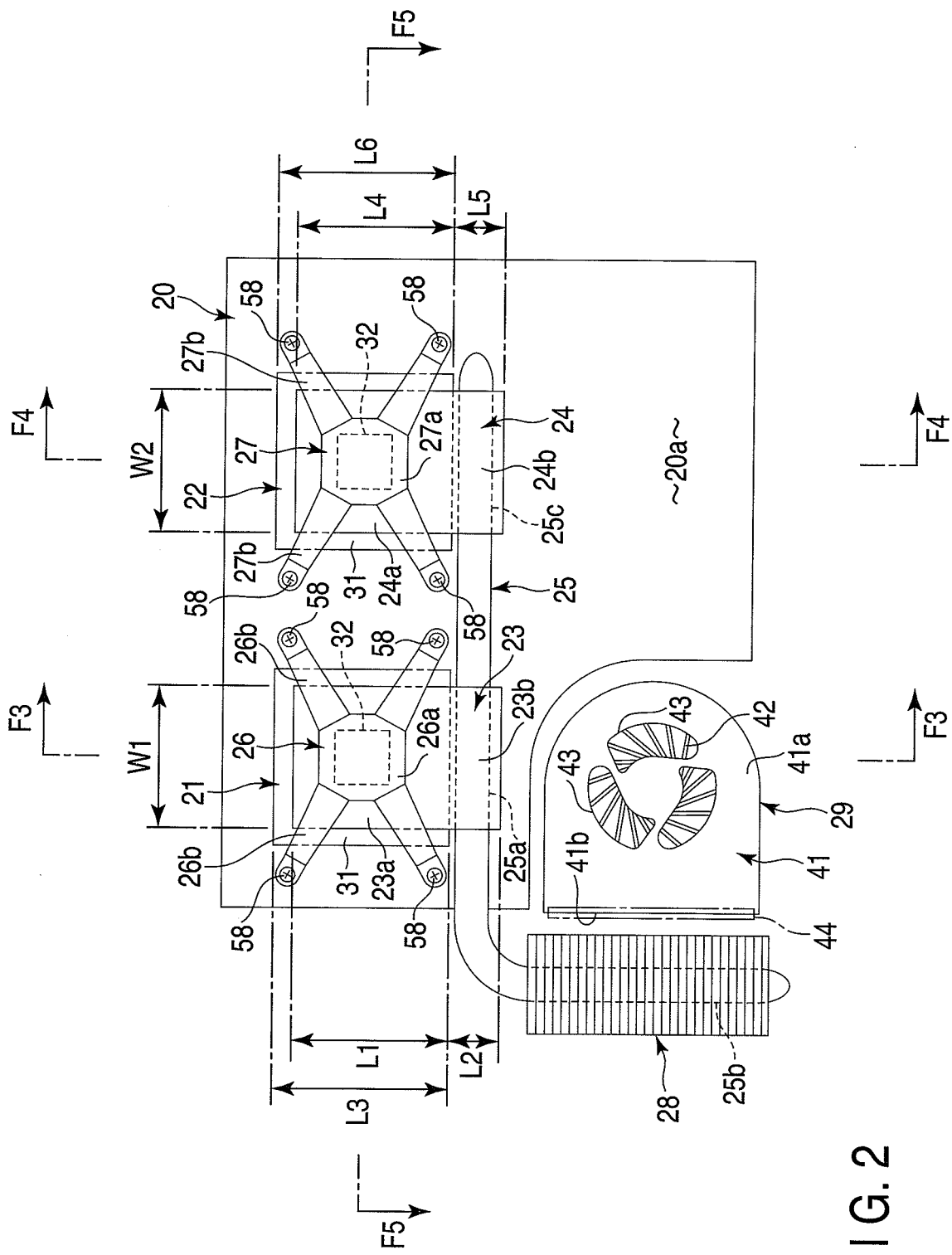
FIG. 2 is an exemplary plan view illustrating a heat radiating structure according to the first embodiment.

As shown in FIGS. 1 and 2, the housing 6 accommodates a circuit board 20, first and second heating elements 21 and 22, first and second sub heat pipes 23 and 24, a main heat pipe 25, first and second pressing members 26 and 27, a heat sink 28, and a cooling fan 29.

As shown in FIG. 1, the circuit board 20 is substantially horizontal in the housing 6. The circuit board 20 is, for example, the main board. As shown in FIG. 3, the circuit board 20 comprises a first surface 20a and a second surface 20b. The second surface 20b is opposite to the first surface 20a. The first surface 20a is, for example, an upper surface. The second surface 20b is, for example, a lower surface. The first and second surfaces 20a and 20b may be reversed.

As shown in FIGS. 2 to 4, for example, the first and second heating elements 21 and 22 are mounted on the same surface (for example, the first surface 20a) of the circuit board 20. The first and second heating elements 21 and 22 are electronic parts that generate heat in use. Each of the first and second heating elements 21 and 22 includes a base board 31 and a die 32 (IC chip) mounted on the base board 31.

The first heating element 21 is, for example, a CPU. As shown in FIG. 3, for example, the first heating element 21 is mounted on a socket 33, and the socket 33 is mounted on the circuit board 20. That is, the first heating element 21 is mounted on the circuit board 20 via the socket 33. The second heating element 22 is, for example, a graphic chip. As shown in FIG. 4, for example, the second heating element 22 is directly mounted on the circuit board 20.

Each of the first and second heating elements 21 and 22 may have the socket 33 or may be directly mounted on the circuit board 20. The first and second heating elements 21 and 22 are not limited to the above-mentioned example, but any kind of parts requiring heat radiation, such as North Bridge (trademark) and memories, may be used as the heating elements.

As shown in FIGS. 2 and 3, the first sub heat pipe 23 is attached to the first heating element 21. The first sub heat pipe 23 is an example of a "first heat pipe". The first sub heat pipe 23 serves as a heat receiving portion that receives heat generated from the first heating element 21 and transmits the heat to the main heat pipe 25.

As shown in FIGS. 2 and 3, the first sub heat pipe 23 is formed in a substantially rectangular plate shape in a plan view and has a size protruding from the first heating element 21. A width W1 of the first sub heat pipe 23 is larger than that of the die 32 of the first heating element 21.

The first sub heat pipe 23 comprises a first portion 23a and a second portion 23b. The first portion 23a overlaps the first heating element 21 in the vertical direction (that is, in a plan view) and faces the first heating element 21. The first portion 23a is adhered to the first heating element 21 with a heat transfer grease 35 interposed therebetween. In this way, the first portion 23a is thermally connected to the first heating element 21 and serves as a heat receiving portion of the first sub heat pipe 23.

As shown in FIGS. 2 and 3, the second portion 23b protrudes from the first heating element 21. In the specification, "the second portion protrudes from the heating element" means that the second portion does not overlap the heating element in a plan view (FIG. 2). That is, the second portion 23b is arranged outside the first heating element 21.

The second portion 23b faces the circuit board 20. The second portion 23b is fixed to the main heat pipe 25 by, for example, soldering or caulking. In this way, the second portion 23b is thermally connected to the main heat pipe 25 and serves as a heat radiating portion of the first sub heat pipe 23. As described above, the width W1 of the first sub heat pipe 23 is larger than that of the die 32 of the first heating element 21.

In this way, a relatively large contact area between the first sub heat pipe 23 and the main heat pipe 25 is ensured.

For example, a length L2 of the second portion 23b (that is, the length of the second portion 23b in the direction of protruding from the first heating element 21) is less than a length L1 of the first portion 23a. For example, the second portion 23b has an only sufficient size to be attached to the main heat pipe 25. In addition, for example, the length L2 of the second portion 23b is less than a length L3 of the first heating element 21 (that is, the length in the direction in which the first sub heat pipe 23 extends). The first sub heat pipe 23 includes only a region facing the first heating element 21 and a region protruding from the first heating element 21, and the entire heat pipe length thereof is relatively small.

The first sub heat pipe 23 comprises a container 37 and a working fluid enclosed in the container 37, and transfers the heat received by the first portion 23a to the second portion 23b using evaporation heat and the capillary phenomenon.

Figure 6:
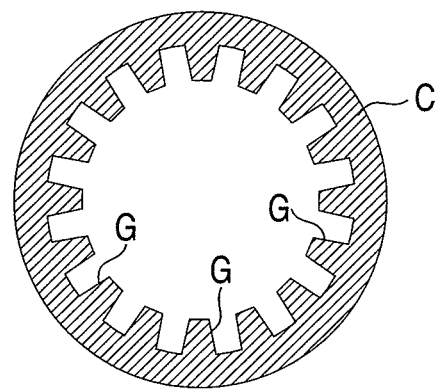
FIG. 6 is an exemplary cross-sectional view illustrating an example of a groove-type heat pipe.

The first sub heat pipe 23 is, for example, a groove-type heat pipe. As shown in FIG. 6, the groove-type heat pipe comprises grooves G formed in the wall surface of a pipe (container C), and the working liquid moves through the grooves G. FIG. 6 shows a tubal heat pipe for comparison with FIG. 7. The groove-type heat pipe generally has a high thermal performance and stability. In addition, the groove-type heat pipe is characterized in that, when the heat pipe length is small and the groove-type heat pipe is inclined, there is little deterioration in the performance (that is, there is little reduction in heat transport capability when it is inclined), but when the heat pipe length is large and the groove-type heat pipe is inclined, there is a large deterioration in the performance.

As shown in FIGS. 2 and 4, the second sub heat pipe 24 is attached to the second heating element 22. The second sub heat pipe 24 is an example of a "third heat pipe". The second sub heat pipe 24 has substantially the same structure as the first sub heat pipe 23. The second sub heat pipe 24 serves as a heat receiving portion that receives heat generated from the second heating element 22 and transmits the heat to the main heat pipe 25. That is, the second sub heat pipe 24 may also be referred to as "another first heat pipe".

As shown in FIGS. 2 and 4, the second sub heat pipe 24 is formed in a substantially rectangular plate shape in a plan view and has a size protruding from the second heating element 22. A width W2 of the second sub heat pipe 24 is larger than that of the die 32 of the second heating element 22.

The second sub heat pipe 24 comprises a first portion 24a and a second portion 24b. The first portion 24a overlaps the second heating element 22 in the vertical direction (that is, in a plan view) and faces the second heating element 22. The first portion 24a is adhered to the second heating element 22 with the heat transfer grease 35 interposed therebetween. In this way, the first portion 24a is thermally connected to the second heating element 22 and serves as a heat receiving portion of the second sub heat pipe 24.

As shown in FIGS. 2 and 4, the second portion 24b protrudes from the second heating element 22. The second portion 24b is arranged outside the second heating element 22. The second portion 24b faces the circuit board 20. The second portion 24b is fixed to the main heat pipe 25 by, for example, soldering or caulking.

In this way, the second portion 24b is thermally connected to the main heat pipe 25 and serves as a heat radiating portion of the second sub heat pipe 24. As described above, the width W2 of the second sub heat pipe 24 is larger than that of the die 32 of the second heating element 22. In this way, a relatively large contact area between the second sub heat pipe 24 and the main heat pipe 25 is ensured.

For example, a length L5 of the second portion 24b (that is, the length of the second portion 24b in the direction of protruding from the second heating element 22) is less than a length L4 of the first portion 24a. For example, the second portion 24b has an only sufficient size to be attached to the main heat pipe 25. In addition, for example, the length L5 of the second portion 24b is less than a length L6 of the second heating element 22 (that is, the length in the direction in which the second sub heat pipe 24 extends). The second sub heat pipe 24 includes only a region facing the second heating element 22 and a region protruding from the second heating element 22, and the entire heat pipe length is relatively small.

The second sub heat pipe 24 comprises a container 38 and a working fluid enclosed in the container 38, and transfers the heat received by the first portion 24a to the second portion 24b using evaporation heat and the capillary phenomenon. Similarly to the first sub heat pipe 23, the second sub heat pipe 24 is, for example, a groove-type heat pipe.

As shown in FIG. 2, the cooling fan 29 is provided adjacent to the circuit board 20. The cooling fan 29 comprises a case 41 and an impeller 42 rotated in the case 41. The case 41 comprises air intakes 43 provided in an upper surface 41a and a lower surface and a discharge hole 44 provided in a side surface 41b.

The cooling fan 29 draws air in the housing 6 through the air intakes 43 and discharges the air to the heat sink 28 through the discharge hole 44. In this way, the cooling fan 29 cools the heat sink 28. The heat sink 28 faces the discharge hole 44 of the cooling fan 29. The heat sink 28 is, for example, a fin unit comprising a plurality of fins.

As shown in FIG. 2, the main heat pipe 25 is connected to the first and second sub heat pipes 23 and 24 and the heat sink 28. The main heat pipe 25 is an example of a "second heat pipe". The main heat pipe 25 serves as a heat transport portion that transports heat generated from the first and second heating elements 21 and 22 to the heat sink 28. The inner spaces of the heat pipes 23, 24, and 25 are not connected to each other, but the working liquids are independently contained in the heat pipes 23, 24, and 25.

The main heat pipe 25 is arranged at a position offset from the first and second heating elements 21 and 22 (that is, a position where the main heat pipe 25 does not overlap the first and second heating elements 21 and 22). The main heat pipe 25 extends from the first and second sub heat pipes 23 and 24 to the heat sink 28 and has a relatively large length. The length of the main heat pipe 25 is larger than those of the first and second sub heat pipes 23 and 24. The term "heat pipe length" means the overall length of the heat pipe.

The main heat pipe 25 has a substantially tubal shape and is thicker than the first and second sub heat pipes 23 and 24. The heat transport capability of the main heat pipe 25 is higher than those of the first and second sub heat pipes 23 and 24. For example, the main heat pipe 25 is capable of transmitting the total amount of heat transported from the two sub heat pipes 23 and 24 to the heat sink 28.

As shown in FIG. 2, the main heat pipe 25 comprises first to third portions 25a, 25b, and 25c. As shown in FIG. 3, the first portion 25a extends between the second portion 23b of the first sub heat pipe 23 and the circuit board 20. The first portion 25a is fixed to the second portion 23b of the first sub heat pipe 23 in a region that deviates from the first heating element 21 and is connected to the second portion 23b of the first sub heat pipe 23. In this way, the first portion 25a is thermally connected to the second portion 23b of the first sub heat pipe 23 and serves as a first heat receiving portion that receives heat from the first sub heat pipe 23.

The first sub heat pipe 23 comprises a first surface 51 facing the first heating element 21 and a second surface 52 opposite to the first surface 51. The first surface 51 faces the circuit board 20. The main heat pipe 25 is fixed to the first surface 51 (that is, the surface facing the first heating element 21) of the first sub heat pipe 23 and faces the first heating element 21 horizontally.

As shown in FIG. 4, the third portion 25c extends between the second portion 24b of the second sub heat pipe 24 and the circuit board 20. That is, the third portion 25c is fixed to the second portion 24b of the second sub heat pipe 24 in a region that deviates from the second heating element 22 and is connected to the second portion 24b of the second sub heat pipe 24. In this way, the third portion 25c is thermally connected to the second portion 25b of the second sub heat pipe 24 and serves as a second heat receiving portion that receives heat from the second sub heat pipe 24.

The second sub heat pipe 24 comprises a first surface 53 facing the second heating element 22 and a second surface 54 opposite to the first surface 53. The first surface 53 faces the circuit board 20. The main heat pipe 25 is fixed to the first surface 53 (that is, the surface facing the second heating element 22) of the second sub heat pipe 24 and faces the second heating element 22 horizontally.

As shown in FIG. 2, the second portion 25b of the main heat pipe 25 is attached to the heat sink 28 and is thermally connected to the heat sink 28. The second portion 25b serves as a heat radiating portion that emits heat to the heat sink 28. As shown in FIG. 3, the main heat pipe 25 comprises a container 56 and a working fluid enclosed in the container 56, and transfers the heat received by the first and third portions 25a and 25c to the second portion 25b using evaporation heat and the capillary phenomenon.

Figure 7:
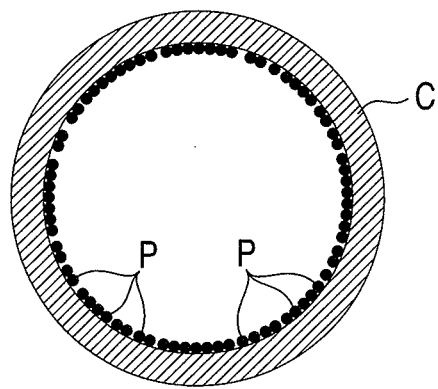
FIG. 7 is an exemplary cross-sectional view illustrating an example of a powder-type heat pipe.

The main heat pipe 25 is, for example, a powder-type heat pipe. As shown in FIG. 7, the powder-type heat pipe comprises, for example, copper powder P sintered to the inner surface of the pipe (container C) and the working liquid moves through the copper powder P.

The powder-type heat pipe has a small reduction in heat transport capability even in a top heat state. In the powder-type heat pipe, even when the heat pipe length is relatively large, there is little deterioration when the heat pipe is inclined (that is, there is little deterioration in the heat transport capability when the heat pipe is inclined). That is, in the powder-type heat pipe, when the heat pipe length is relatively large, the heat transport capability when the heat pipe is inclined is higher than that of the groove-type heat pipe. However, in general, the powder-type heat pipe is heavier and more expensive than the groove-type heat pipe.

As shown in FIG. 5, the first and second pressing members 26 and 27 are attached to the first and second sub heat pipes 23 and 24, respectively. The first pressing member 26 comprises a pressing portion 26a and leg portions 26b. The pressing portion 26a has, for example, a plate shape and faces the first portion 23a of the first sub heat pipe 23. The leg portions 26b extend from the edge of the pressing portion 26a, are fixed to the circuit board 20 by, for example, screws 58, and support the pressing portion 26a.

The pressing portion 26a and the leg portions 26b serve as a leaf spring in cooperation with each other. The first pressing member 26 presses the first portion 23a of the first sub heat pipe 23 against the first heating element 21 and strengthens the thermal connection between the first sub heat pipe 23 and the first heating element 21.

For example, the thickness of the first sub heat pipe 23 is about 1 mm. As described above, the first sub heat pipe 23 is a hollow heat pipe. That is, for example, the thickness of the wall of the container 37 is about 0.3 mm. The first sub heat pipe 23 has flexibility so as to be deformed by the pressing force of the first pressing member 26. For example, the first sub heat pipe 23 is configured to be bent by about 0.5 mm by a force of about 2 kgf.

That is, the first sub heat pipe 23 is pressed against the first heating element 21 by the first pressing member 26 and can be bent following the inclination or shape of the die 32 of the first heating element 21. Therefore, the first sub heat pipe 23 is less likely to come into partial contact with the die 32 of the first heating element 21.

Similar to the first pressing member 26, the second pressing member 27 comprises a pressing portion 27a and leg portions 27b. The pressing portion 27a has, for example, a plate shape and faces the first portion 24a of the second sub heat pipe 24. The leg portions 27b extend from the edge of the pressing portion 27a, are fixed to the circuit board 20 by, for example, the screws 58, and support the pressing portion 27a.

The pressing portion 27a and the leg portions 27b serve as a leaf spring in cooperation with each other. The second pressing member 27 presses the first portion 24a of the second sub heat pipe 24 against the second heating element 22 and strengthens the thermal connection between the second sub heat pipe 24 and the second heating element 22.

For example, the thickness of the second sub heat pipe 24 is about 1 mm. For example, the thickness of the wall of the container 38 is about 0.3 mm. The second sub heat pipe 24 has flexibility so as to be deformed by the pressing force of the second pressing member 27. For example, the second sub heat pipe 24 is configured to be bent by about 0.5 mm by a force of about 2 kgf.

That is, the second sub heat pipe 24 is pressed against the second heating element 22 by the second pressing member 27 and can be bent following the inclination or shape of the die 32 of the second heating element 22. Therefore, the second sub heat pipe 24 is less likely to come into partial contact with the die 32 of the second heating element 22.

There is a tolerance (hereinafter, referred to as parts tolerance) based on the dimensional tolerance of the height of the first heating element 21 and the dimensional tolerance of the height of the second heating element 22 between the first and second heating elements 21 and 22. The first and second sub heat pipes 23 and 24 are flexibly bent according to the heights of the first and second heating elements 21 and 22 to absorb the parts tolerance between the first and second heating elements 21 and 22. Therefore, even when the first and second sub heat pipes 23 and 24 are adhered to the first and second heating elements 21 and 22 through the heat transfer grease 35, an excessive load is not applied to any of the first and second heating elements 21 and 22.

The main heat pipe 25 has a sufficient rigidity not to be bent by the pressing force of the first and second pressing members 26 and 27. The main heat pipe 25 and the heat sink 28 do not have a direct support structure. The main heat pipe 25 and the heat sink 28 are supported by fixing the first and second sub heat pipes 23 and 24 with the first and second pressing members 26 and 27.

According to the above-mentioned structure, it is possible to reduce the thickness of the electronic apparatus 1 and improve the cooling performance.

A general heat pipe extends from the heating element to the heat sink and has a relatively large length. The heat pipe with a relatively large length needs to ensure a sufficient heat transport performance corresponding to the length. Therefore, the heat pipe needs to have a certain thickness. When the thick heat pipe is arranged above or below the heating element and the heating element, the circuit board, and the heat pipe overlap each other, it is difficult to reduce the thickness of an electronic apparatus.

However, in this embodiment, the main heat pipe 25 (second heat pipe) with a relatively large length, a relatively large thickness, and a high heat transport performance is arranged at a position offset from the heating element 21, and the sub heat pipe 23 (first heat pipe) is provided between the main heat pipe 25 and the heating element 21. The sub heat pipe 23 has a relatively small length and does not require a high heat transport performance. Therefore, it is possible to use the plate-shaped sub heat pipe 23 with a small thickness.

That is, in this embodiment, the plate-shaped sub heat pipe 23 with a small thickness overlaps the circuit board 20 and the heating element 21, and the main heat pipe 25 with a relatively large thickness is arranged so as not to overlap the heating element 21. Therefore, it is possible to reduce the overall thickness of a heat radiating structure and thus reduce the thickness of the electronic apparatus 1.

It is also considered that the main heat pipe 25 is arranged at a position offset from the heating element 21 and a sheet-metal member for heat transfer is provided between the main heat pipe 25 and the heating element 21. However, the sheet-metal member does not have high heat conductivity. Therefore, the sheet-metal member needs to have a sufficient thickness to transmit heat generated from the heating element 21 to the main heat pipe 25.

Since the thick sheet-metal member has high rigidity, it is difficult to sufficiently bend the sheet-metal member. Therefore, when the sheet-metal member is closely adhered to the heating element 21 with the heat transfer grease 35, there is a concern that the sheet-metal member will come into partial contact with the die 32 of the heating element 21 and the die 32 will be damaged. Therefore, when the sheet-metal member is used, it is necessary to provide a flexible heat transfer sheet between the sheet-metal member and the heating element 21. In general, since the heat conductivity of the heat transfer sheet is significantly lower than that of the heat transfer grease 35, heat loss occurs between the heating element 21 and the main heat pipe 25.

In the structure according to this embodiment, the sub heat pipe 23 is provided between the heating element 21 and the main heat pipe 25. The heat transport capability of the sub heat pipe 23 is higher than that of the sheet-metal member. Therefore, even when the same heat transfer performance is ensured, it is possible to reduce the thickness of the sub heat pipe 23, as compared to, for example, the sheet-metal member. It is possible to ensure the flexibility of the thin sub heat pipe 23 and it is expected that the thin sub heat pipe 23 will be bent.

Even when the sub heat pipe 23 is closely adhered to the heating element 21, the sub heat pipe 23 is flexibly deformed according to the inclination of the die 32 of the heating element 21 or the shape of the surface thereof and it is possible to suppress, for example, the damage of the die 32 due to partial contact. Therefore, it is not necessary to provide a heat transfer sheet between the sub heat pipe 23 and the heating element 21 and it is possible to closely adhere the sub heat pipe 23 to the heating element 21 via the heat transfer grease 35 with high heat conductivity. As a result, it is possible to reduce the heat loss between the heating element 21 and the main heat pipe 25 and significantly improve the cooling performance of the electronic apparatus 1.

Since the main heat pipe 25 does not need to have a sufficient flexibility to be bent by the pressing force of the pressing member 26, it can be formed with a relatively large thickness. Since the main heat pipe 25 has a high heat transport capability, it is possible to further improve the cooling efficiency of the electronic apparatus 1.

In this embodiment, a so-called multi-heat-receiving structure is provided, and one main heat pipe 25 is thermally connected to the first and second heating elements 21 and 22. For comparison, a multi-heat-receiving structure including a sheet-metal member without flexibility is considered.

In this case, when the sheet-metal members facing the first and second heating elements 21 and 22 are fixed to the main heat pipe 25, there is a concern that at least one of the sheet-metal members will come into partial contact with the heating element or an excessive load will be applied therebetween due to the parts tolerance between the first and second heating elements 21 and 22.

Therefore, in order to absorb the parts tolerance, it is necessary to provide a flexible heat transfer sheet between one of the heating elements and the sheet-metal member. As described above, since the heat conductivity of the heat transfer sheet is lower than that of the heat transfer grease 35, heat loss occurs between the heating element and the main heat pipe 25.

However, according to this embodiment, even when the first and second sub heat pipes 23 and 24 are fixed to the main heat pipe 25, at least one of the first and second sub heat pipes 23 and 24 is bent to absorb the parts tolerance between the first and second heating elements 21 and 22.

Therefore, it is not necessary to provide the heat transfer sheet and it is possible to closely adhere the first and second sub heat pipes 23 and 24 to the first and second heating elements 21 and 22 with the heat transfer grease 35, respectively. In this way, the heat loss between the first and second heating elements 21 and 22 and the main heat pipe 25 is reduced, and the cooling performance of the electronic apparatus 1 is improved.

Neither the first sub heat pipe 23 nor the second sub heat pipe 24 needs to have flexibility, and for example, the second sub heat pipe 24 may have a sufficient rigidity not to be bent. In this structure, the first sub heat pipe 23 is bent to absorb the parts tolerance. When both the first and second sub heat pipes 23 and 24 have flexibility, the first and second sub heat pipes 23 and 24 are appropriately bent due to the parts tolerance. Therefore, it is possible to more flexibly absorb the parts tolerance.

In the multi-heat-receiving structure, one heat pipe transports heat generated from the two heating elements 21 and 22. Therefore, the heat pipe has a large size and a large thickness. According to this embodiment, since the thick heat pipe (main heat pipe 25) is arranged at a position offset from the first and second heating elements 21 and 22, it is possible to reduce the thickness of the multi-heat-receiving structure.

When the main heat pipe 25 is fixed to the first surface 51 (the surface facing the first heating element 21) of the sub heat pipe 23, the main heat pipe 25 is arranged in parallel to the heating element 21. Therefore, it is possible to reduce the overall thickness.

The main heat pipe 25 has a heat pipe length larger than that of the sub heat pipe. In the case a reduction in the heat transport capability of the main heat pipe 25 is small when it is inclined, it is possible to stably transmit heat received from the sub heat pipe 23 to the distant heat sink 28.

In this embodiment, the sub heat pipe 23 that has a relatively small length and is little affected by a reduction in heat transport capability when it is inclined is of a groove type that has low heat transport capability when it is inclined but is advantageous in weight and costs. The main heat pipe 25 that has a relatively large length and is greatly affected by the reduction in heat transport capability when it is inclined is of a powder type in which the heat transport capability is less likely to be reduced when the main heat pipe is inclined. According to the above-mentioned structure, it is possible to optimize the overall cooling performance, weight, and costs of the electronic apparatus 1.

Next, a modification of this embodiment will be described with reference to FIG. 8.

Figure 8:
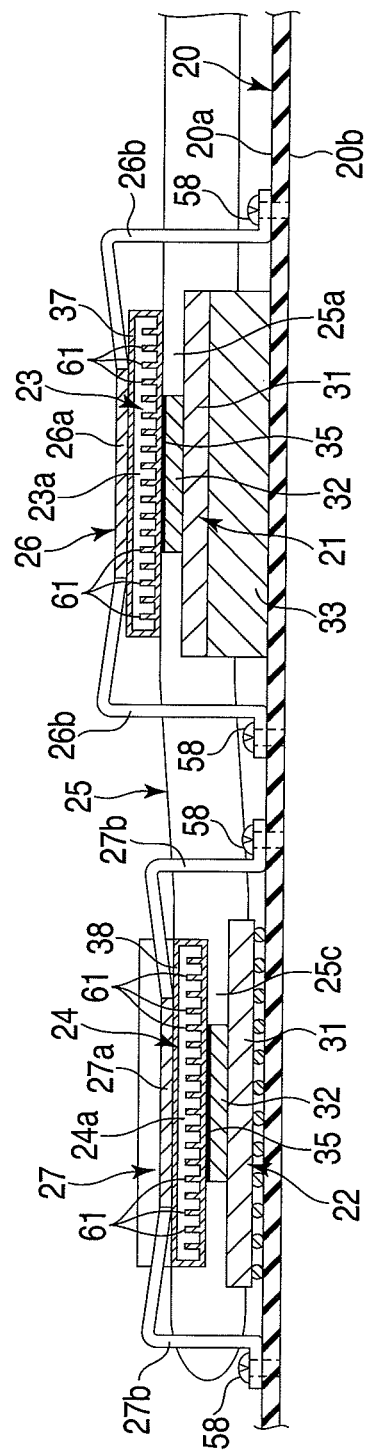
FIG. 8 is an exemplary cross-sectional view illustrating a modification of the heat radiating structure according to the first embodiment.

As shown in FIG. 8, the first portions 23a and 24a of the first and second sub heat pipes 23 and 24 include ribs 61 provided in the containers 37 and 38, respectively. The ribs 61 rise in the pressing direction of the first and second pressing members 26 and 27.

The first portions 23a and 24a of the first and second sub heat pipes 23 and 24 are strongly pressed and deformed by the first and second pressing members 26 and 27. The ribs 61 provided in the first portions make it possible to prevent the inner spaces of the first and second sub heat pipes 23 and 24 from being excessively broken by the pressing force of the first and second pressing members 26 and 27.

Second Embodiment

Next, an electronic apparatus 1 according to a second embodiment will be described with reference to FIGS. 9 and 10. In the second embodiment, components having the same or similar functions as those in the first embodiment are denoted by the same reference numerals and a description thereof will be omitted. The second embodiment is similar to the first embodiment except for the following structure.

Figure 9:
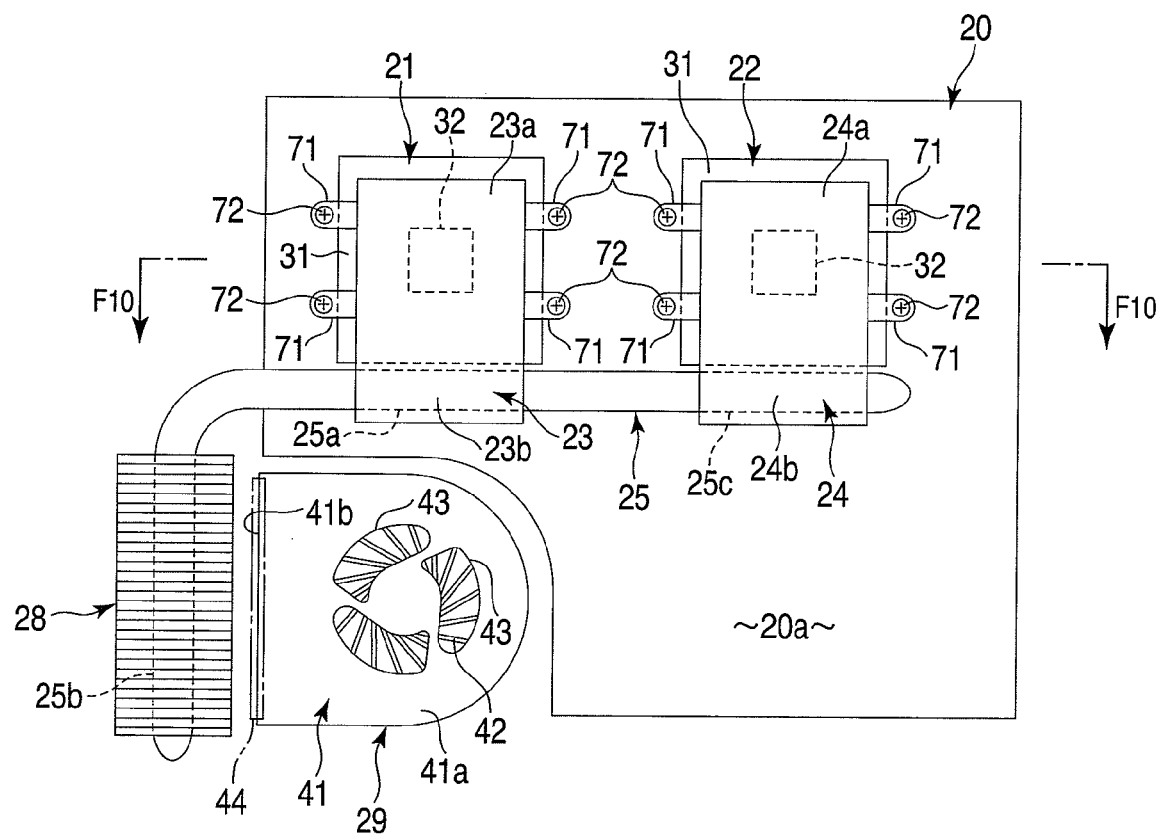
FIG. 9 is an exemplary plan view illustrating a heat radiating structure according to a second embodiment.
Figure 10:
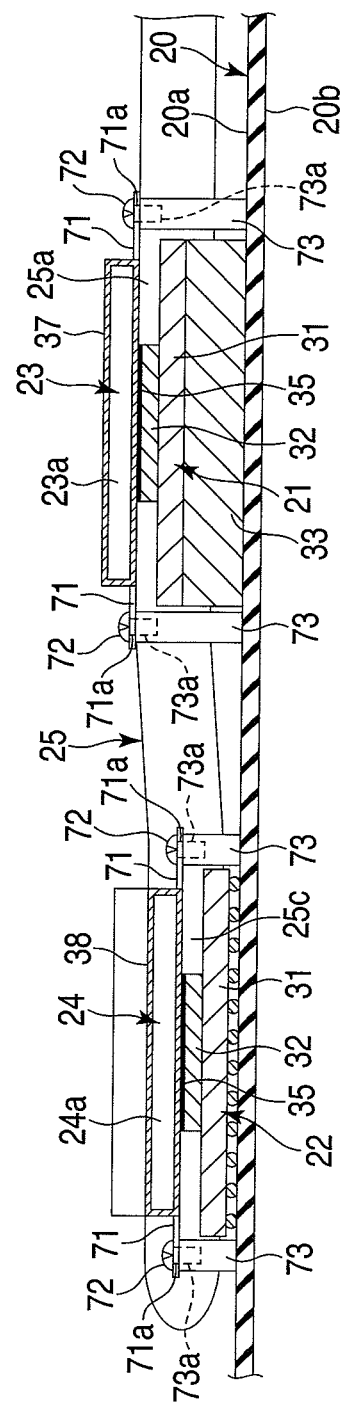
FIG. 10 is an exemplary cross-sectional view illustrating the heat radiating structure taken along the line F10-F10 of FIG. 9.

As shown in FIGS. 9 and 10, in this embodiment, the pressing member comprising the pressing portion and the leg portions is not provided. The first and second sub heat pipes 23 and 24 comprise protruding portions 71 provided on the containers 37 and 38, respectively. The protruding portion 71 comprises an insertion hole 71a into which a screw 72 is inserted. As shown in FIG. 10, studs 73 are vertically provided on the circuit board 20. The stud 73 faces the protruding portion 71 and comprises a screw hole 73a.

The screw 72 is inserted into the insertion hole 71a of the protruding portion 71 and is then engaged with the screw hole 73a of the stud 73. When the screws 72 are fixed to the studs 73, the first and second sub heat pipes 23 and 24 are pressed against the first and second heating elements 21 and 22, respectively. The screw 72 is an example of a "first pressing member" and a "second pressing member"

According to the above-mentioned structure, similar to the first embodiment, it is possible to reduce the thickness of the electronic apparatus 1 and improve the cooling performance.

Third Embodiment

Figure 11:
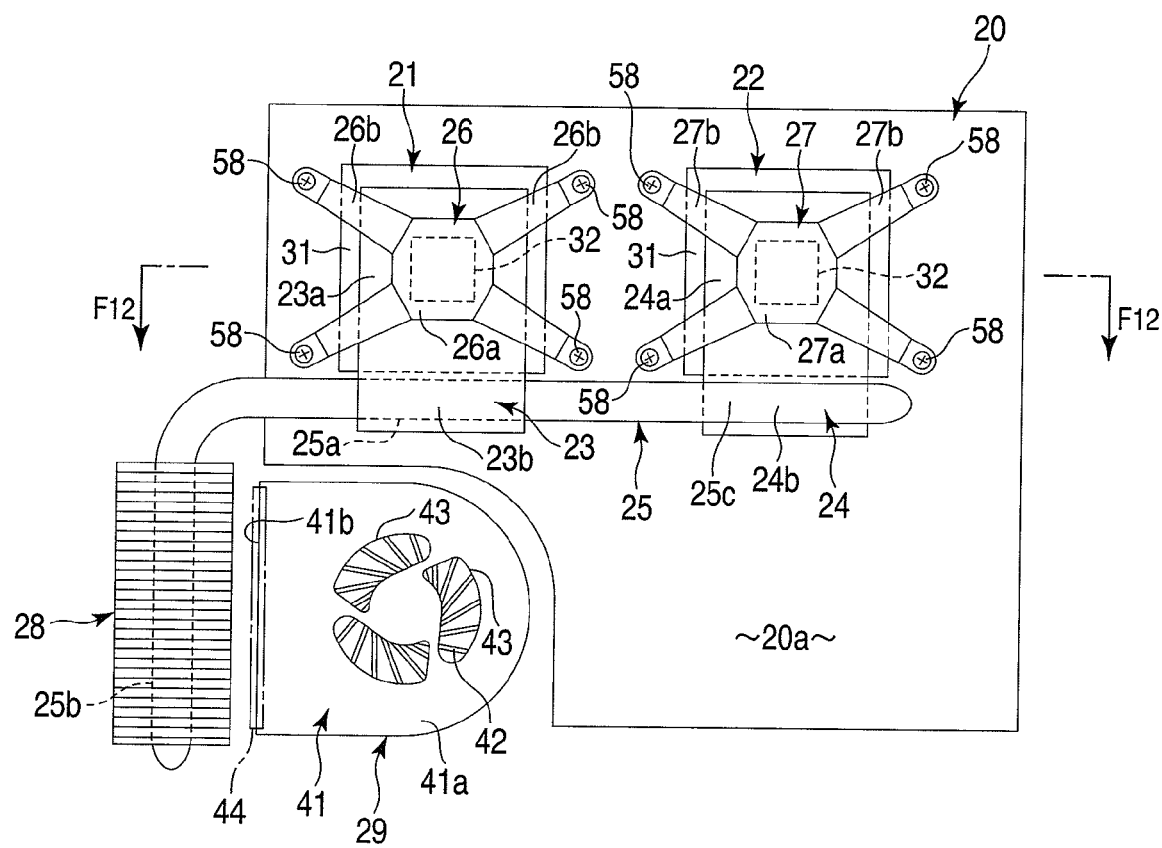
FIG. 11 is an exemplary plan view illustrating a heat radiating structure according to a third embodiment.

Next, an electronic apparatus 1 according to a third embodiment will be described with reference to FIGS. 11 and 12. In the third embodiment, components having the same or similar functions as those in the first embodiment are denoted by the same reference numerals and a description thereof will be omitted. The third embodiment is similar to the first embodiment except for the following structure.

For example, the main heat pipe 25 may pass on the second surfaces 52 and 54 (the surfaces opposite to the circuit board 20) of the first and second sub heat pipes 23 and 24. As shown in FIG. 12, in this embodiment, for example, the main heat pipe 25 is fixed to the second surface 54 of the second sub heat pipe 24.

According to the above-mentioned structure, similar to the first embodiment, it is possible to reduce the thickness of the electronic apparatus 1 and improve the cooling performance. As shown in FIG. 13, even when the main heat pipe 25 is fixed to the second surface 54 of the sub heat pipe 24, it is possible to reduce the thickness of the electronic apparatus 1 since the main heat pipe 25 is offset from the heating element 22.

The electronic apparatuses 1 according to the first to third embodiments have been described above, but the embodiments are not limited thereto. The components according to the first to third embodiments may be appropriately combined with each other. The invention is not limited to the above-described embodiments, but the components may be changed without departing from the scope and spirit of the invention.

The first and second sub heat pipes 23 and 24 are not limited to the groove type. The main heat pipe 25 is not limited to the powder type. The main heat pipe 25 and the first and second sub heat pipes 23 and 24 may be of the same type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing;
   a circuit board in the housing;
   a first heating element on the circuit board;
   a heat sink in the housing;
   a first heat pipe located away from the heat sink and comprising a first portion and a second portion, the first portion thermally connected to the first heating element; and
   a second heat pipe thicker than the first heat pipe, the second heat pipe comprising a portion located between the second portion of the first heat pipe and the circuit board, the second heat pipe connected to the second portion of the first heat pipe and the heat sink in order to transfer heat from the second portion of the first heat pipe to the heat sink.

2. The apparatus of claim 1, wherein the second heat pipe comprises a first end portion connected to the second portion of the first heat pipe, and a second end portion connected to the heat sink on a side opposite to the first end portion.

3. The apparatus of claim 1, further comprising
   a fan comprising a discharge hole through which air is discharged toward the heat sink, wherein the first heat pipe is away from a region located in front of the discharge hole of the fan.

4. The apparatus of claim 1, wherein the first heat pipe is located inside the circuit board from a perspective of a thickness direction of the circuit board.

5. The apparatus of claim 1, wherein
   the first heating element comprises a base board and a die on the base board,
   the first portion of the first heat pipe overlaps the base board from a perspective of a thickness direction of the circuit board,
   the second portion of the first heat pipe is outside the base board from the perspective of the thickness direction of the circuit board, and
   a length of the second portion of the first heat pipe is shorter than a length of the first portion of the first heat pipe in an extending direction of the first heat pipe.

6. The apparatus of claim 1, wherein
   the first heating element comprises a base board and a die on the base board,
   the second portion of the first heat pipe is outside the base board from a perspective of a thickness direction of the circuit board, and
   a length of the second portion of the first heat pipe is shorter than a length of a side of the base board of the first heating element in an extending direction of the first heat pipe.

7. An electronic apparatus comprising:
   a housing;
   a circuit board in the housing;
   a first heating element on the circuit board;
   a second heating element on the circuit board;
   a heat sink in the housing;
   a first heat pipe comprising a first portion and a second portion, the first portion thermally connected to the first heating element;
   a second heat pipe thicker than the first heat pipe, the second heat pipe comprising portion located between the second portion of the first heat pipe and the circuit board, the second heat pipe connected to the second portion of the first heat pipe and the heat sink, and
   a third heat pipe comprising a first portion and a second portion, the first portion of the third heat pipe thermally connected to the second heating element, wherein
   the second heat pipe comprises a portion located between the second portion of the third heat pipe and the circuit board, and the second heat pipe is connected to the second portion of the third heat pipe.

8. The apparatus of claim 7, wherein
   the first heating element comprises a first surface and a second surface, the first surface facing the circuit board, the second surface being opposite to the first surface and facing the first heat pipe, and
   at least a part of the second heat pipe comprises a surface facing a surface of the circuit board on which the first heating element is mounted, and the surface of the second heat pipe is closer to the circuit board than the second surface of the first heating element is.

9. The apparatus of claim 7, wherein the second heat pipe has a higher heat transport capability and is longer than the first heat pipe.

10. The apparatus of claim 7, further comprising:
    a pressing member configured to press the first heat pipe,
    wherein the first heat pipe is configured to be deformable toward the first heating element by a pressing force from the pressing member.

11. The apparatus of claim 7, wherein the first heat pipe comprises a surface facing the first heating element, and the second heat pipe is attached to the surface of the first heat pipe.

12. The apparatus of claim 7, wherein
    the first heat pipe is of a groove type, and
    the second heat pipe is longer than the first heat pipe, is of a powder type, and is configured to have a reduction in a heat transfer capability when inclined that is less than a reduction in the heat transfer capability of the first heat pipe when inclined.

13. An electronic apparatus comprising:
a housing;
a circuit board in the housing;
a first heating element on the circuit board;
a second heating element on the circuit board;
a heat sink in the housing;
a first heat pipe comprising a first portion facing the first heating element, and a second portion away from the first heating element;
a second heat pipe comprising a first portion facing the second heating element, and a second portion away from the second heating element; and
a third heat pipe comprising a first heat receiving portion, a second heat receiving portion, and a heat radiating portion, the first heat receiving portion located between the second portion of the first heat pipe and the circuit board and thermally connected to the first heat pipe, the second heat receiving portion located between the second portion of the second heat pipe and the circuit board and thermally connected to the second heat pipe, the heat radiating portion connected to the heat sink.

14. An electronic apparatus comprising:
a housing;
a circuit board in the housing;
a first heating element on the circuit board;
a heat sink in the housing;
a first heat pipe located away from the heat sink and comprising a first portion and a second portion, the first portion thermally connected to the first heating element; and
a second heat pipe comprising a portion located between the second portion of the first heat pipe and the circuit board, the second heat pipe connected to the second portion of the first heat pipe and the heat sink in order to transfer heat from the second portion of the first heat pipe to the heat sink.

15. An electronic apparatus comprising:
a housing,
a circuit board in the housing;
a first heating element on the circuit board;
a heat sink in the housing;
a first heat pipe thermally connected to the first heating element;
a second heat pipe comprising a first portion thermally connected to the first heat pipe, and a second portion thermally connected to the heat sink, the first heat pipe and the second heat pipe being connected to each other at a region away from the first heating element;
a second heating element on the circuit board; and
a third heat pipe thermally connected to the second heating element and thermally connected to the second heat pipe.

16. The apparatus of claim 15, wherein
the first heating element comprises a first surface and a second surface, the first surface facing the circuit board, the second surface being opposite to the first surface and facing the first heat pipe, and
at least a part of the second heat pipe comprises a surface closer to the circuit board than the second surface of the first heating element.

17. The apparatus of claim 15, wherein the second heat pipe has a higher heat transport capability and is longer than the first heat pipe.

18. The apparatus of claim 15, wherein the third heat pipe and the second heat pipe are connected to each other at a region away from the second heating element.

19. The apparatus of claim 15, further comprising:
a first pressing member configured to press the first heat pipe,
wherein the first heat pipe is configured to be deformable toward the first heating element by a pressing force from the first pressing member.

20. The apparatus of claim 19, further comprising:
a second pressing member configured to press the second heat pipe,
wherein the second heat pipe is configured to be deformable toward the second heating element by a pressing force from the second pressing member.

21. The apparatus of claim 15, wherein the first heat pipe comprises a surface facing the first heating element, and the second heat pipe is attached to the surface of the first heat pipe.

22. The apparatus of claim 15, wherein
the first heat pipe is of a groove type, and
the second heat pipe is longer than the first heat pipe, is of a powder type, and is configured to have a reduction in a heat transfer capability when inclined that is less than a reduction in the heat transfer capability of the first heat pipe when inclined.

* * * * *